(12) United States Patent
Ho et al.

(10) Patent No.: US 9,601,460 B2
(45) Date of Patent: Mar. 21, 2017

(54) CHIP PACKAGE INCLUDING RECESS IN SIDE EDGE

(71) Applicant: XINTEC INC., Taoyuan (TW)

(72) Inventors: Yen-Shih Ho, Kaohsiung (TW);
Tsang-Yu Liu, Zhubei (TW);
Chia-Sheng Lin, Taoyuan (TW);
Chia-Ming Cheng, New Taipei (TW);
Shu-Ming Chang, New Taipei (TW);
Tzu-Wen Tseng, Xinpu Township (TW)

(73) Assignee: XINTEC INC., Tauyuan (TW)

( * ) Notice: Subject to any disclaimer, the term of this patent is extended or adjusted under 35 U.S.C. 154(b) by 0 days.

(21) Appl. No.: 14/618,413

(22) Filed: Feb. 10, 2015

(65) Prior Publication Data
US 2015/0228536 A1    Aug. 13, 2015

(30) Foreign Application Priority Data

Feb. 11, 2014 (TW) .............................. 103104366 A (51) Int. Cl.
| | |
|---|---|
| *H01L 23/06* | (2006.01) |
| *H01L 23/00* | (2006.01) |
| *H01L 23/31* | (2006.01) |
| *H01L 29/06* | (2006.01) |
| *H01L 23/525* | (2006.01) |

(52) U.S. Cl.
CPC .......... *H01L 24/94* (2013.01); *H01L 23/3114* (2013.01); *H01L 23/3178* (2013.01); *H01L 29/0657* (2013.01); *H01L 23/525* (2013.01); *H01L 2224/94* (2013.01)

(58) Field of Classification Search
CPC ................. H01L 21/302; H01L 21/784; H01L 21/76838; H01L 23/50; H01L 24/94
USPC .......................................................... 257/773
See application file for complete search history.

(56) References Cited

U.S. PATENT DOCUMENTS

| | | | | |
|---|---|---|---|---|
| 2008/0017971 A1* | 1/2008 | Hollis | ................. | H01L 23/5386 257/698 |
| 2013/0285240 A1* | 10/2013 | Last | ...................... | H01L 23/481 257/738 |

* cited by examiner

*Primary Examiner* — Matthew Gordon
(74) *Attorney, Agent, or Firm* — Liu & Liu (57) ABSTRACT

A chip package including a semiconductor substrate is provided. A recess is in the semiconductor substrate and adjoins a side edge of the semiconductor substrate, wherein the semiconductor substrate has at least one spacer protruding from the bottom of the recess. A conducting layer is disposed on the semiconductor substrate and extends into the recess.

21 Claims, 11 Drawing Sheets

CHIP PACKAGE INCLUDING RECESS IN SIDE EDGE

CROSS REFERENCE TO RELATED APPLICATIONS

This Application is based on, and claims priority of Taiwan Patent Application No. 103104366, filed on Feb. 11, 2014, the entirety of which is incorporated by reference herein.

BACKGROUND OF THE INVENTION

Field of the Invention

The invention relates to chip packages and methods for forming the same, and in particular to chip packages formed by a wafer-level packaging process.

Description of the Related Art

The chip packaging process is an important step in the fabrication of an electronic product. Chip packages not only protect the chips therein from outer environmental contaminants, but they also provide electrical connection paths between electronic elements inside and those outside of the chip packages.

Manufacturing processes of chip packages comprise forming conducting layers on a substrate to electrically connect conducting pads and forming external conducting structures, such as wires or solder balls, to electrically connect the conducting layers.

However, the external conducting structures formed on the substrate increase the entire size of the chip package. As a result, it is difficult to further decrease the size of chip packages made therefrom.

Thus, there exists a need in the art for development of a chip package and methods for forming the same capable of mitigating or eliminating the aforementioned problems.

BRIEF SUMMARY OF THE INVENTION

An embodiment of the invention provides a chip package comprising a semiconductor substrate. A recess is located in the semiconductor substrate and adjoins a side edge of the semiconductor substrate. The semiconductor substrate has at least one spacer protruding from a bottom of the recess. A conducting layer is disposed on the semiconductor substrate and extends into the recess.

An embodiment of the invention provides a chip package comprising a semiconductor substrate. A recess is located in the semiconductor substrate, and adjoins a side edge of the semiconductor substrate. The recess extends along an entire length of the side edge of the semiconductor substrate. A sidewall of the recess has a first portion and a second portion adjoining the first portion. A first distance between the first portion and the side edge is greater than a second distance between the second portion and the side edge as viewed from a top-view perspective. A conducting layer is disposed on the semiconductor substrate and extends into the recess.

An embodiment of the invention provides a method for forming a chip package comprising providing a semiconductor substrate. A portion of the semiconductor substrate is removed to form a recess in the semiconductor substrate and at least one spacer in the recess. The spacer protrudes from a bottom of the recess. A conducting layer is formed on the semiconductor substrate and extends into the recess.

An embodiment of the invention provides a method for forming a chip package comprising providing a semiconductor substrate. A portion of the semiconductor substrate is removed to form a first recess in the semiconductor substrate. The first recess has a first portion and a second portion adjoining the first portion. A first distance between two opposite sidewalls of the first portion is greater than a second distance between two opposite sidewalls of the second portion as viewed from a top-view perspective. A conducting layer is formed on the semiconductor substrate and extends into the first recess.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive elements or electronic components of integrated circuits, such as digital or analog circuits. For example, the chip package may be related to optoelectronic devices, micro-electro-mechanical systems (MEMS), biometric devices, microfluidic systems, and physical sensors measuring changes to physical quantities such as heat, light, capacitance, pressure, and so on. In particular, a wafer-level packaging (WSP) process may optionally be used to package semiconductor chips, such as image-sensor elements, light-emitting diodes (LEDs), solar cells, RF circuits, accelerators, gyroscopes, fingerprint recognition devices, micro actuators, surface acoustic wave devices, pressure sensors, ink printer heads, and so on.

The above-mentioned wafer-level packaging process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level packaging process. In addition, the above-mentioned wafer-level packaging process may also be adapted to form a chip package having multi-layer integrated circuit devices by stacking a plurality of wafers having integrated circuits.

Figure 1A:
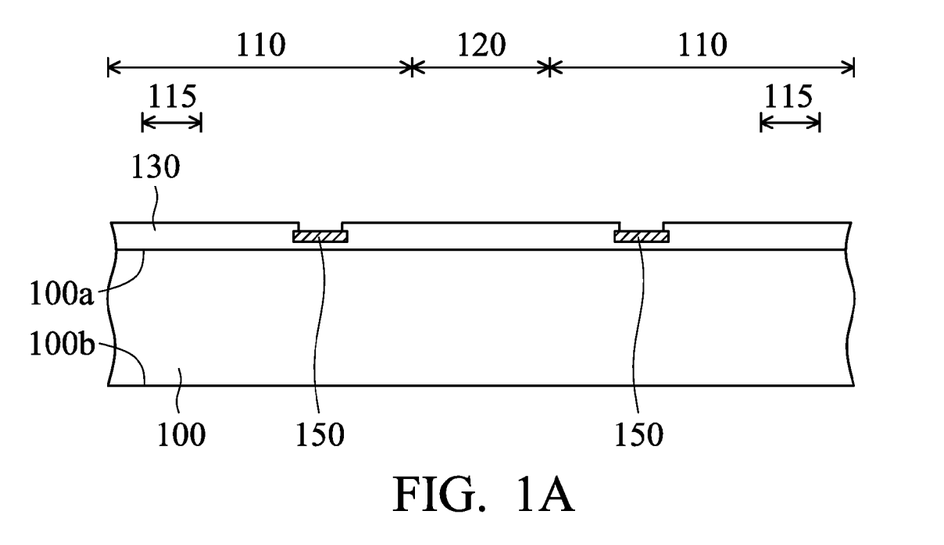
FIGS. 1A to 1E are cross-sectional views of an exemplary embodiment of a method for forming a chip package according to the invention.
Figure 1B:
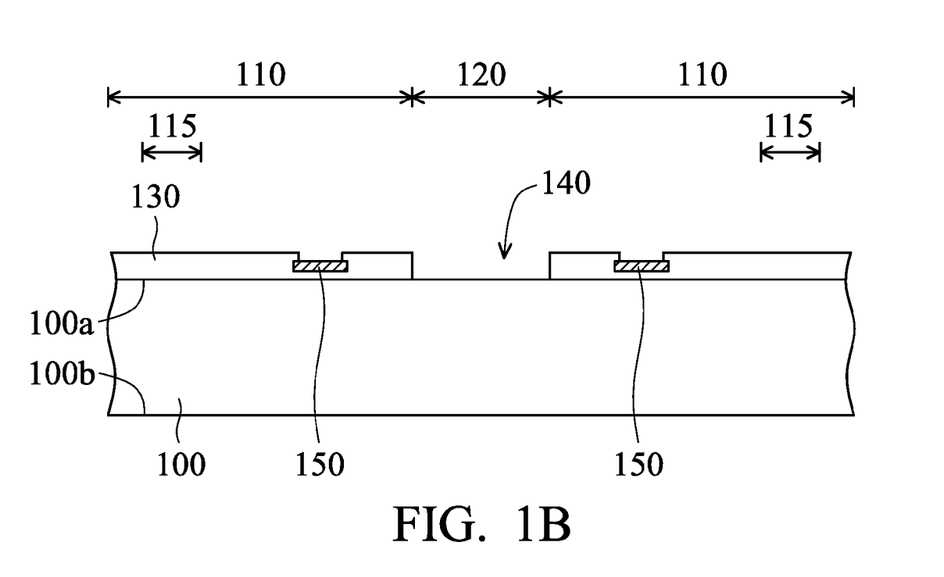
Figure 1C:
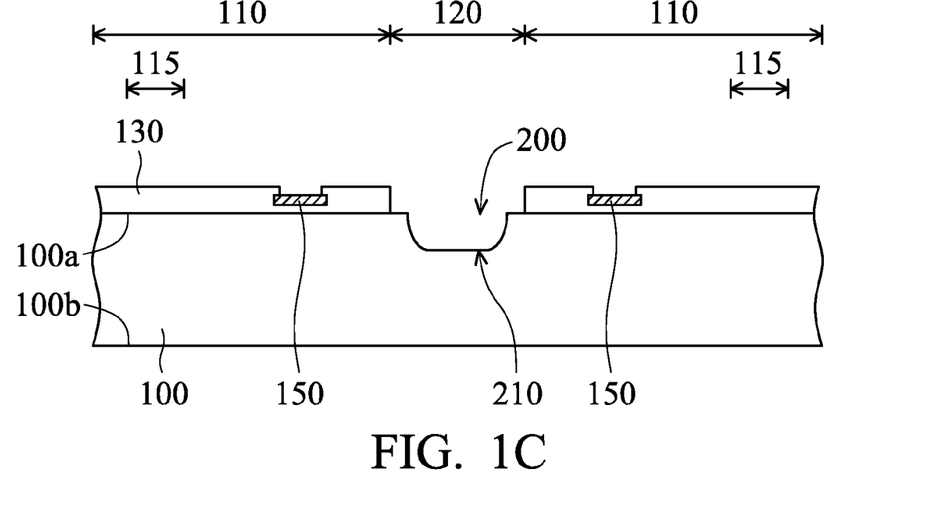
Figure 1D:
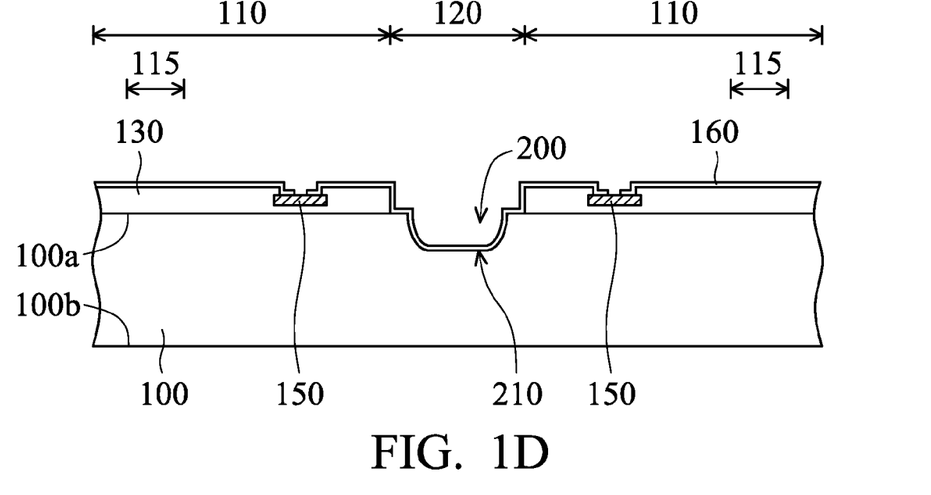
Figure 1E:
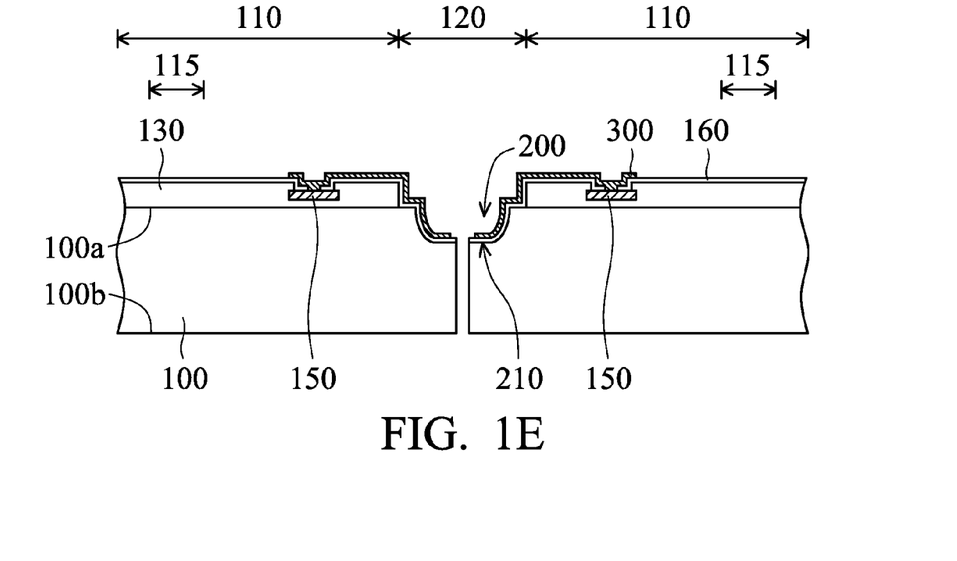
Figure 2:
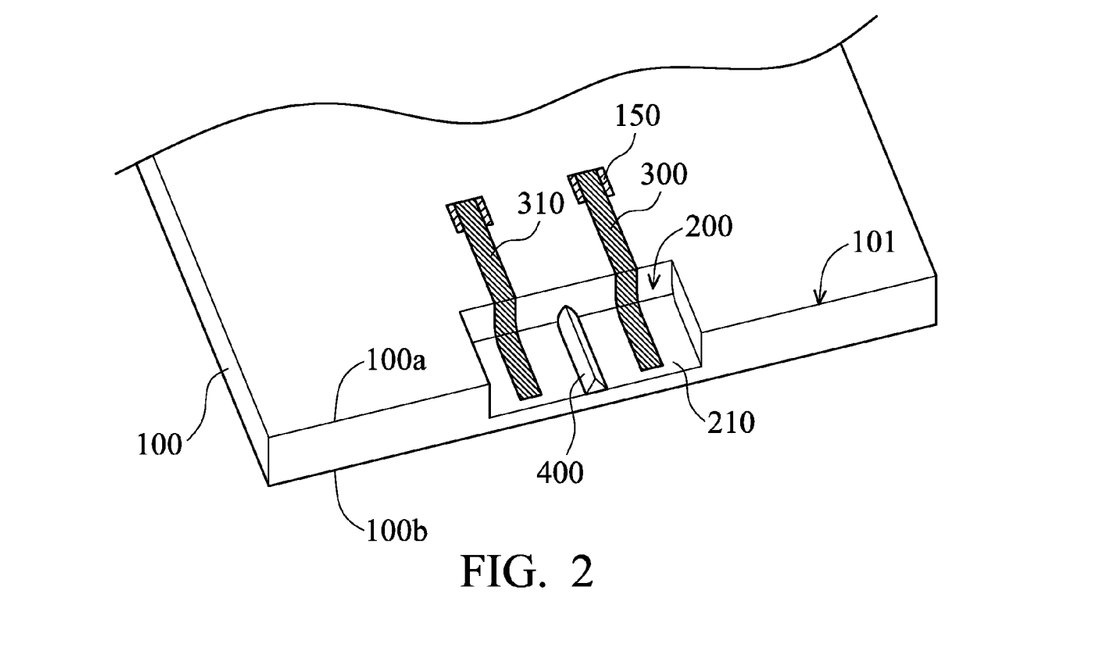
FIG. 2 is a partial perspective view of an exemplary embodiment of a chip package according to the invention.

A cross-sectional view and a partial perspective view of an exemplary embodiment of a chip package according to the invention are respectively illustrated in FIG. 1E and FIG. 2. In order to clearly show the relative positions of elements in the chip package, a dielectric layer 130 and a passivation layer 160 are shown in FIG. 1E without being illustrated in FIG. 2.

In the embodiment, the chip package comprises a semiconductor substrate 100, a recess 200, a spacer 400, and a plurality of conducting layers 300 and 310. The semiconductor substrate 100 has a first surface 100a and a second surface 100b opposite thereto. The semiconductor substrate 100 comprises a chip region 110. The chip region 110 comprises a device region 115. The device region 115 may comprise a sensor device (not shown), such as an image-sensor device. In one embodiment, the semiconductor substrate 100 may be a silicon substrate.

In the embodiment, the chip package further comprises a dielectric layer 130 disposed on the first surface 100a of the semiconductor substrate 100. The dielectric layer 130 may be a single dielectric layer or it may comprise multiple dielectric layers. In the embodiment, the dielectric layer 130 may comprise oxide, nitride or another suitable dielectric material.

In the embodiment, the semiconductor substrate 100 in the chip region 110 comprises a plurality of conducting pads 150 disposed in the dielectric layer 130 on the first surface 100a. The dielectric layer 130 covers the conducting pads 150 and has openings exposing the conducting pads 150. The conducting pads 150 may be a single conducting layer or comprise multiple conducting layers. The conducting pads 150 may be electrically connected to the sensor device in the device region 115 through interconnection structures (not shown).

The recess 200 is located in the semiconductor substrate 100 and adjoins a side edge 101 (as shown in FIG. 2) of the semiconductor substrate 100 in the chip package. The recess 200 extends from the first surface 100a toward the second surface 100b. In the embodiment, the sidewalls of the recess 200 may be perpendicular to or inclined to the first surface 100a of the semiconductor substrate 100, and the bottom of the recess 200 may be parallel or non-parallel to the first surface 100a of the semiconductor substrate 100. In one embodiment, the bottom 210 and the sidewalls of the recess 200 may be rough and uneven, and have a jagged contour. In other embodiments, the semiconductor substrate 100 may comprise a multi-step recess (not shown) formed of a plurality of continuous recesses.

The spacer 400 protrudes from the bottom 210 of the recess 200, as shown in FIG. 2. The spacer 400 is a part of the semiconductor substrate 100, such that the height of the spacer 400 is equal to or less than the depth of the recess 200. In addition, it should be realized that the number and shape of the spacer 400 shown in figures are illustrated as an example and they are not limited thereto. The actual number and shape of the spacer 400 are determined by design requirements.

In the embodiment, the chip package further comprises a passivation layer 160 disposed on the dielectric layer 130. The passivation layer 160 extends into the opening of the dielectric layer 130 to cover a portion of the conducting pad 150. The passivation layer 160 further extends onto the bottom 210 and the sidewalls of the recess 200 and the spacer 400 in the recess 200. In one embodiment, the passivation layer 160 does not cover the top of the spacer 400. In one embodiment, the passivation layer 160 may comprise epoxy resin, inorganic materials (such as silicon oxide, silicon nitride, silicon oxynitride, metal oxide or a combination thereof), organic polymer materials (such as polyimide, butylcyclobutene (BCB), parylene, polynaphthalenes, fluorocarbons or acrylates) or other suitable dielectric materials.

The conducting layers 300 and 310 (shown in FIG. 2) are disposed on the passivation layer 160. The conducting layers 300 and 310 extend to the conducting pads 150 exposed from the passivation layer 160 to electrically connect to the conducting pads 150. The conducting layers 300 and 310 further extend onto the bottom 210 and the sidewalls of the recess 200. In another embodiment, the conducting layers 300 and 310 may extend onto the sidewalls of the recess 200 without extending to the bottom 210. In one embodiment, the conducting layers 300 and 310 may comprise copper, aluminum, gold, platinum, nickel, tin, a combination thereof, or another suitable conducting material.

Figure 3:
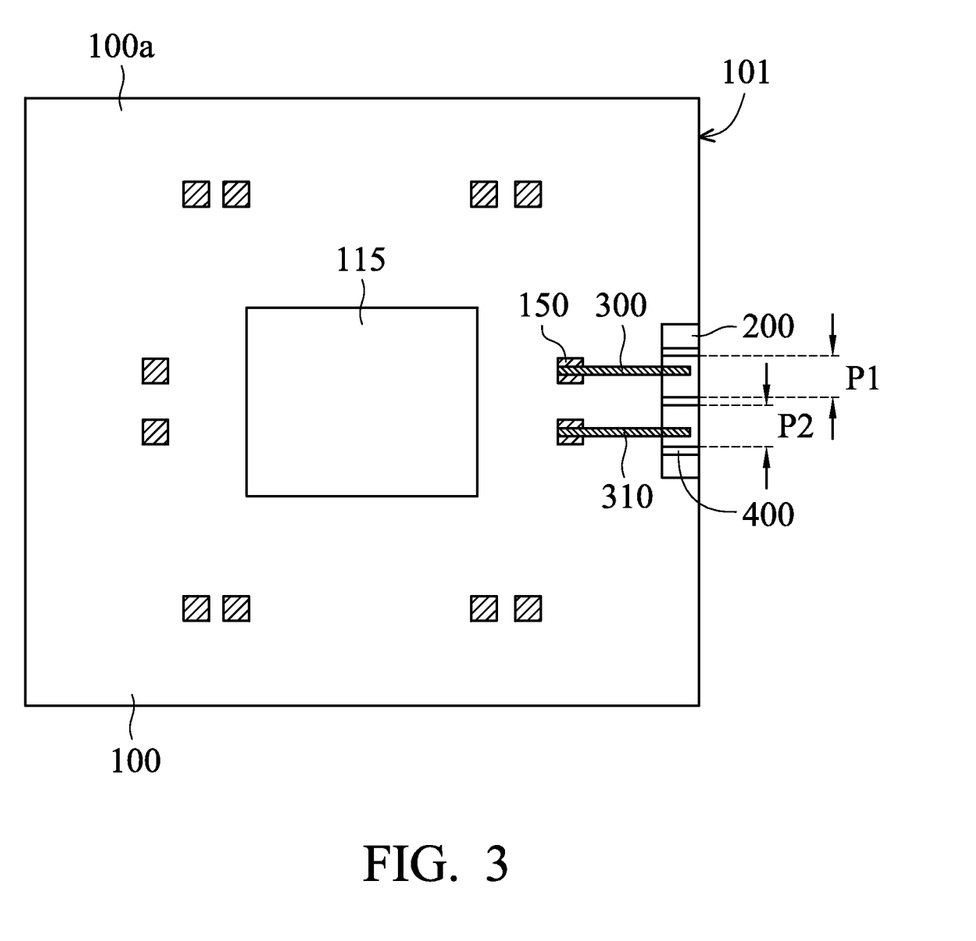
FIGS. 3 and 4 are top-views of various exemplary embodiments of a chip package according to the invention.
Figure 4:
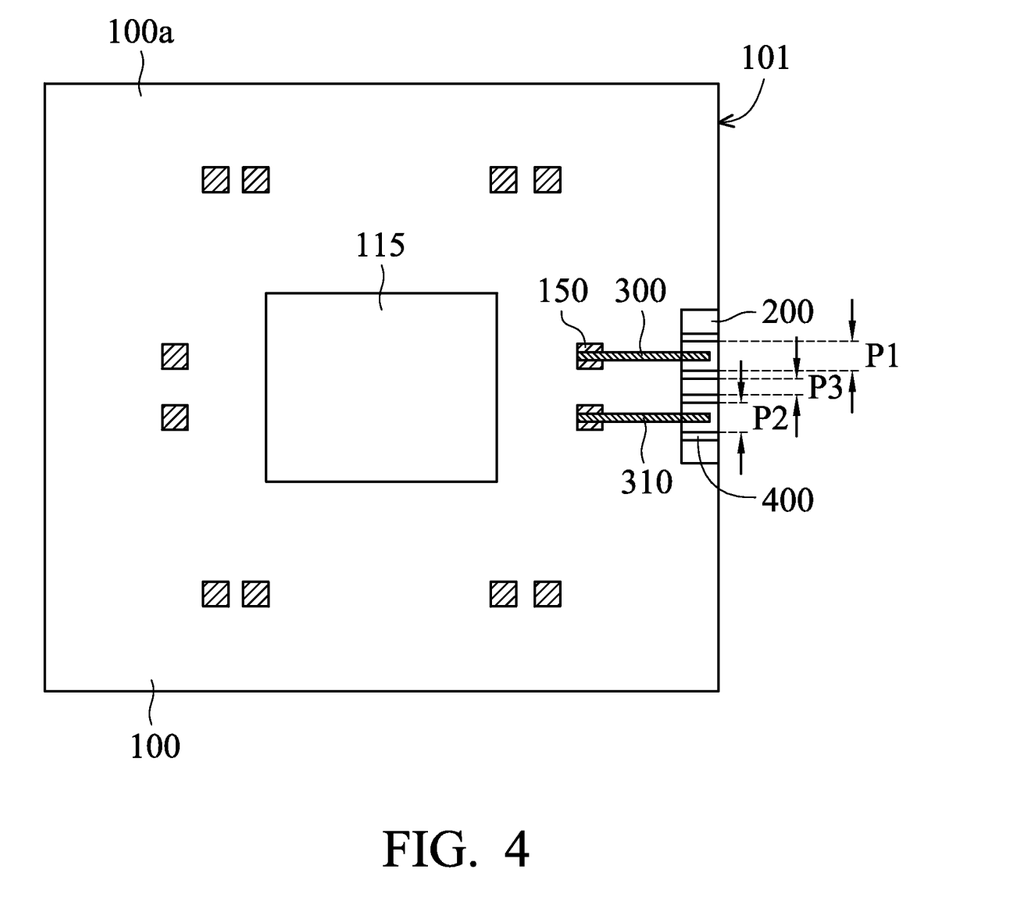
Figure 10:
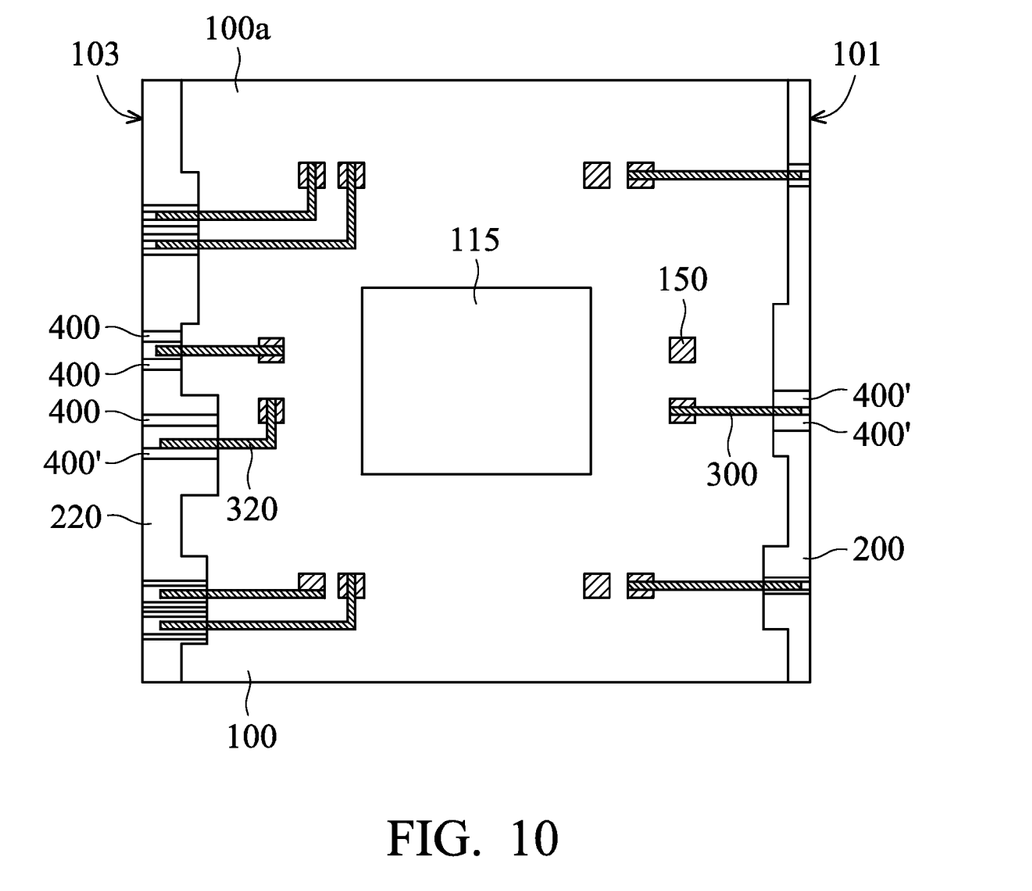

In one embodiment, the spacer 400 extends to the side edge 101 along the extending direction of the conducting layers 300 and 310, and the spacer 400 is located between the conducting layers 300 and 310, as shown in FIG. 2. In another embodiment, the semiconductor substrate 100 of the chip package may comprise a plurality of spacers 400 spaced apart from each other. The pitches P1 and P2 between the spacers 400 may be the same, as shown in FIG. 3. The pitches P1 and P3 between the spacers 400 may be different, as shown in FIG. 4. In one embodiment, each of the conducting layers 300 and 310 may extend between any two of the spacers 400, and there is one spacer 400 located between the conducting layers 300 and 310, as shown in FIG. 3. In another embodiment, there are some spacers 400 located between the conducting layers 300 and 310, as shown in FIG. 4. In one embodiment, as shown in FIG. 10, the conducting layer 300 extends between two spacers 400' and the pitch between the two spacers 400' is not greater than the width of the conducting layer 300. As a result, the conducting layer 300 connects to the two spacers 400'. Moreover, a conducting layer 320 may extend between the spacers 400 and 400'. The pitch between the spacers 400 and 400' is greater than the width of the conducting layer 320, and an edge of the conducting layer 320 adjoins the spacer 400'.

In the embodiment, the chip package may be further disposed on a circuit board (not shown). The conducting layers 300 and 310 extending into the recess 200 are electrically connected to the circuit board through conducting structures (not shown), such as wires or solder balls.

According to the aforementioned embodiments, the chip package comprises the recess located in the semiconductor substrate, such that the conducting layers can extend into the recess. In this regard, when the conducting layers of the chip package are electrically connected to the circuit board through the conducting structures, the height of the conducting structures can be reduced. As a result, the entire size of the chip package is significantly decreased. In addition, since the semiconductor substrate has one or more spacers protruding from the bottom of the recess and located between two conducting layers, short circuits of the conducting layers can be prevented. Therefore, the reliability of the chip package is improved.

Figure 6:
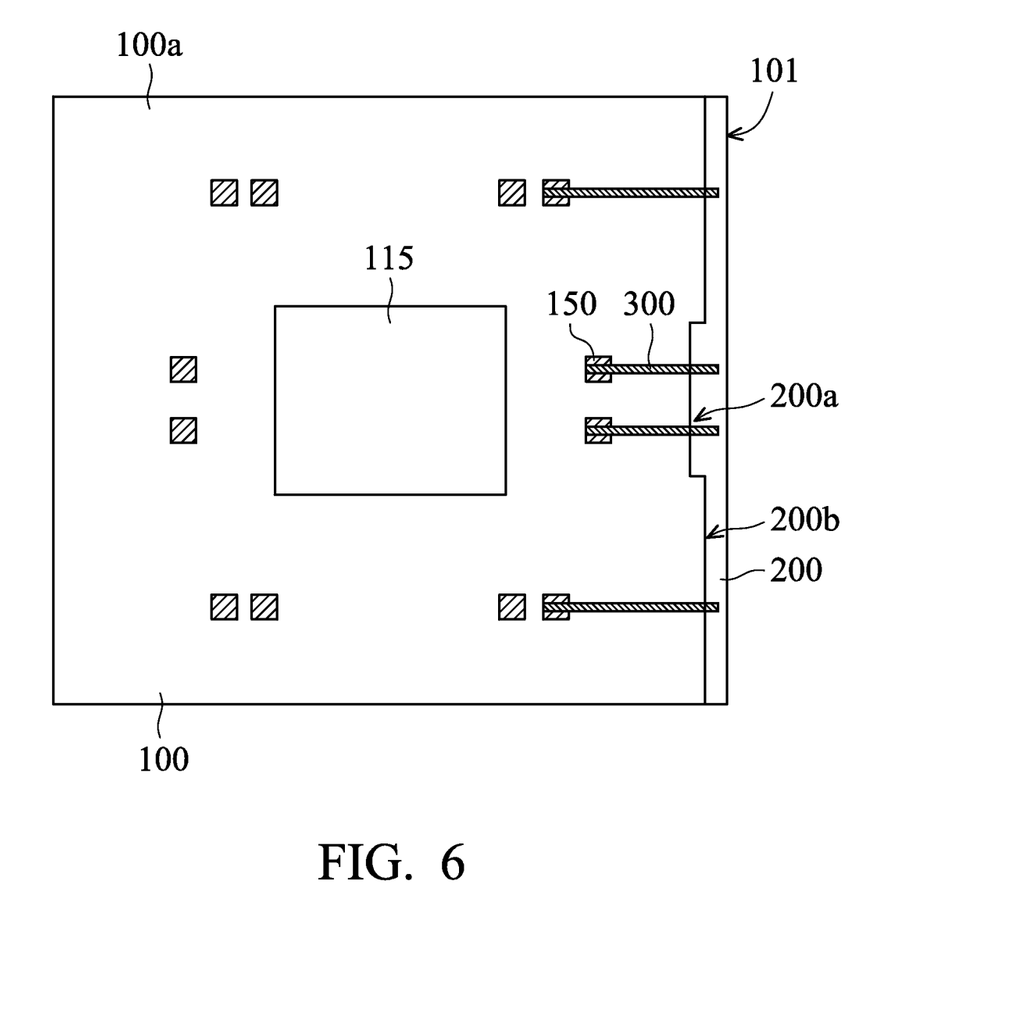
FIGS. 6 to 10 are top-views of various exemplary embodiments of a chip package according to the invention.

A cross-sectional view and a top-view of another exemplary embodiment of a chip package according to the invention are respectively illustrated in FIGS. 1E and 6, wherein elements in FIG. 6 that are the same as those in FIGS. 1E and 2 are labeled with the same reference numbers as in FIGS. 1E and 2 and are not described again for brevity. In order to clearly show the relative positions of elements in the chip package, the dielectric layer 130 and the passivation layer 160 are shown in FIG. 1E without being illustrated in FIG. 6.

In the embodiment, the chip package comprises a semiconductor substrate 100, a recess 200, and a plurality of conducting layers 300. The semiconductor substrate 100 has a first surface 100a and a second surface 100b opposite thereto and comprises a device region 115. The device regions 115 may comprise a sensor device (not shown), such as an image-sensor device. In one embodiment, the semiconductor substrate 100 may be a silicon substrate.

In the embodiment, the chip package further comprises a dielectric layer 130 disposed on the first surface 100a of the semiconductor substrate 100. In the embodiment, the semiconductor substrate 100 in the chip region 110 comprises a plurality of conducting pads 150 disposed in the dielectric layer 130 on the first surface 100a. The dielectric layer 130 covers the conducting pads 150 and has openings exposing the conducting pads 150. The conducting pads 150 may be electrically connected to the sensor device in the device regions 115 through interconnection structures (not shown).

The recess 200 is located in the semiconductor substrate 100 and extends from the first surface 100a toward the second surface 100b. The recess 200 adjoins a side edge 101 of the semiconductor substrate 100 in the chip package and crosses the entire length of the side edge 101, as shown in FIG. 6. The recess 200 has a sidewall portion 200a and another sidewall portion 200b adjoining thereto. The distance between the sidewall portion 200a and the side edge 101 is greater than the distance between the sidewall portion 200b and the side edge 101 as viewed from a top-view perspective. In another embodiment, the distance between the sidewall portion 200a and the side edge 101 may be less than the distance between the sidewall portion 200b and the side edge 101. In addition, it should be realized that the number of sidewall portions, the distance between the sidewall portion and the side edge, the extending direction of the conducting layer, and the position of the conducting pad shown in figures are illustrated as an example and they are not limited thereto.

In the embodiment, the chip package further comprises a passivation layer 160 disposed on the dielectric layer 130. The passivation layer 160 extends into the opening of the dielectric layer 130 to cover a portion of the conducting pad 150. The passivation layer 160 further extends onto the bottom 210 and the sidewalls of the recess 200.

The conducting layers 300 are disposed on the passivation layer 160. The conducting layers 300 extend to the conducting pads 150 exposed from the passivation layer 160 to electrically connect to the conducting pads 150. The conducting layers 300 further extend onto the bottom 210 and the sidewalls of the recess 200. In another embodiment, the conducting layers 300 may extend onto the sidewalls of the recess 200 without extending to the bottom 210. In the embodiment, the conducting layers 300 and 310 may extend to the first portion 200a or the second portion 200b of the recess 200.

According to the aforementioned embodiments, the recess 200 crosses the entire length of the side edge 101 and extends to the corners of the semiconductor substrate 100. As a result, the stress is reduced, such that the semiconductor substrate is prevented from cracking. Moreover, some conducting layers, whose locations are relatively far from the sidewall portion 200a of the recess, can directly extend to the sidewall portion 200b of the recess 200. Therefore, the connective paths of the conducting layers can be significantly shortened, the speed of transmitting signals can be increased, and the occupied surface area of the semiconductor substrate 100 can be reduced.

Top-views of various exemplary embodiments of a chip package according to the invention are illustrated in FIGS. 7 to 10, wherein elements in FIGS. 7 to 10 that are the same as those in FIG. 6 are labeled with the same reference numbers as in FIG. 6 and are not described again for brevity. In order to clearly show the relative positions of elements in the chip package, the dielectric layer 130 and the passivation layer 160 are not illustrated in FIGS. 7 to 10.

Figure 7:
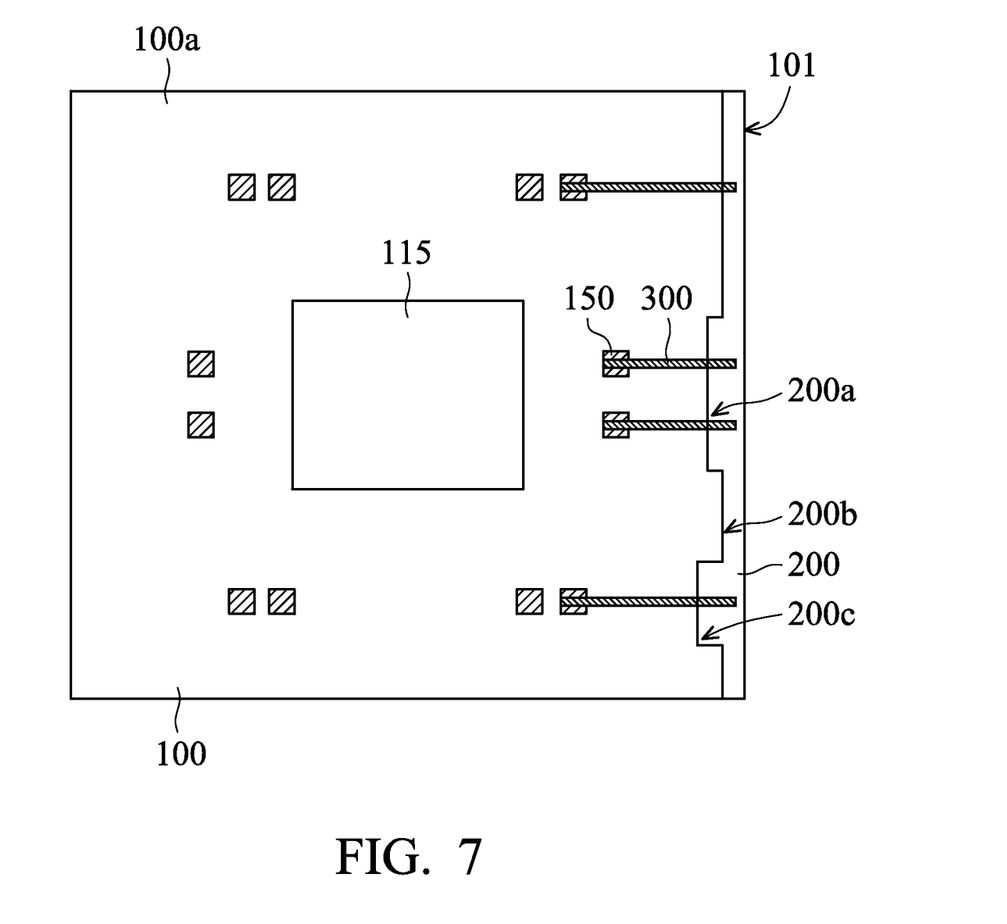

The chip package structure shown in FIG. 7 is similar to that shown in FIG. 6. The difference therebetween is that the recess 200 shown in FIG. 7 further has a sidewall portion 200c adjoining the sidewall portion 200b. The distance between the sidewall portion 200c and the side edge 101 is greater than the distance between the sidewall portion 200a and the side edge 101 and the distance between the sidewall portion 200b and the side edge 101 as viewed from the top-view perspective.

In another embodiment, the distance between the sidewall portion 200c and the side edge 101 may be greater than the distance between the sidewall portion 200b and the side edge 101, and may be less than or equal to the distance between the sidewall portion 200a and the side edge 101. In yet another embodiment, the distance between the sidewall portion 200c and the side edge 101 may be less than the distance between the sidewall portion 200b and the side edge 101, and may be the same as or different from the distance between the sidewall portion 200a and the side edge 101.

Figure 8:
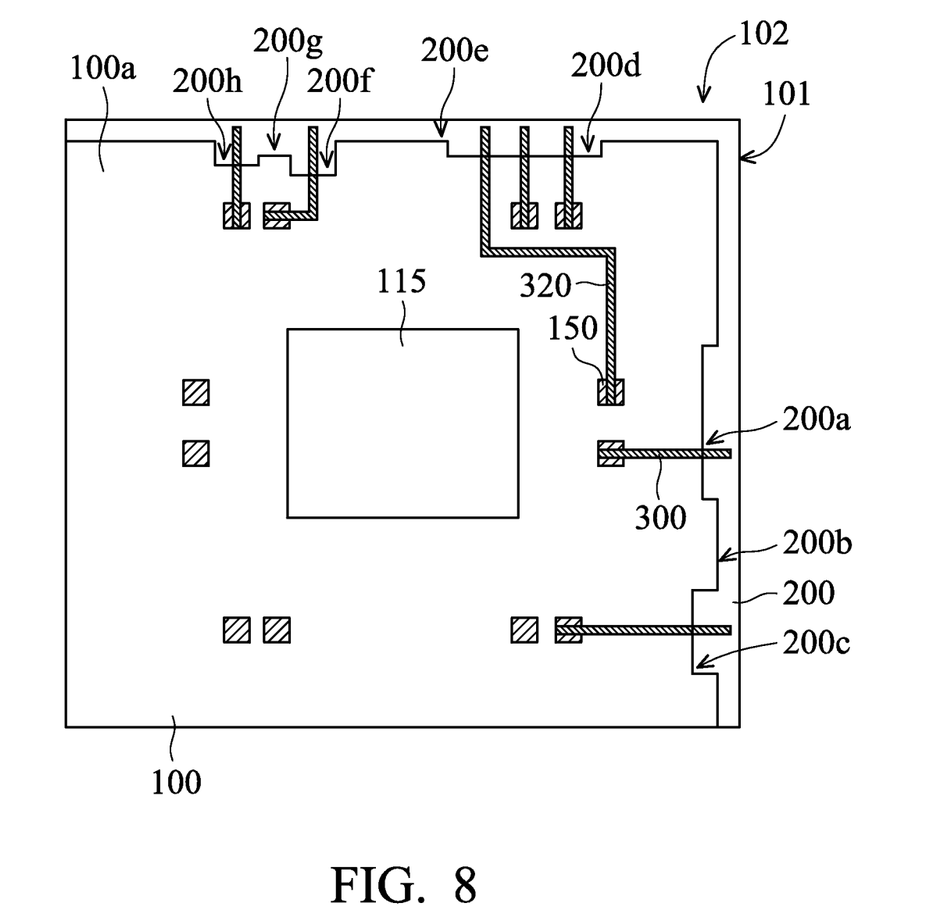

The chip package structure shown in FIG. 8 is similar to that shown in FIG. 7. The difference therebetween is that the recess 200 shown in FIG. 8 further extends across an entire length of a side edge 102 of the semiconductor substrate 100, which adjoins the side edge 101. In another embodiment, the recess 200 may extend along an entire length of two side edges of the semiconductor substrate 100, which are adjacent to the side edge 101. In the embodiment, the recess 200 has sidewall portions 200d, 200e, 200f, 200g, and 200h which extend across an entire length of the side edge 102. The distance between the sidewall portion 200d and the side edge 102 is greater than the distance between the sidewall portion 200e and the side edge 102 as viewed from the top-view perspective. The distance between the sidewall portion 200d and the side edge 102 is equal to the distance between the sidewall portion 200a and the side edge 101. The distance between the sidewall portion 200e and the side edge 102 is equal to the distance between the sidewall portion 200b and the side edge 101.

Moreover, the distance between the sidewall portion 200f and the side edge 102 is greater than the distance between the sidewall portion 200g and the side edge 102 as viewed from the top-view perspective. The distance between the sidewall portion 200f and the side edge 102 is greater than the distance between the sidewall portion 200a and the side edge 101 and the distance between the sidewall portion 200b and the side edge 101. In another embodiment, the distance between the sidewall portion 200f and the side edge 102 may be less than or equal to the distance between the sidewall portion 200a and the side edge 101, and may be the same as or different from the distance between the sidewall portion 200b and the side edge 101. In yet another embodiment, the distance between the sidewall portion 200g and the side edge 102 may be less than or equal to the distance between the sidewall portion 200a and the side edge 101, and may be the same as or different from the distance between the sidewall portion 200b and the side edge 101.

Moreover, the distance between the sidewall portion 200h and the side edge 102 is greater than the distance between the sidewall portion 200g and the side edge 102 and is less than the sidewall portion 200f and the side edge 102. In another embodiment, the distance between the sidewall portion 200h and the side edge 102 may be greater than the distance between the sidewall portion 200g and the side edge 102 and may be less than or equal to the distance between the sidewall portion 200f and the side edge 102. In yet another embodiment, the distance between the sidewall portion 200h and the side edge 102 may be less than the distance between the sidewall portion 200g and the side edge 102, and may be the same as or different from the distance between the sidewall portion 200f and the side edge 102.

In one embodiment, some conducting layers, such as the conducting layers 300, may directly extend to the sidewall portion 200a of the recess 200. Other conducting layers, such as the conducting layers 320, may extend to the sidewall portion 200d of the recess 200.

According to the aforementioned embodiments, since the recess 200 further extends along an entire length of the side edge 102 of the semiconductor substrate 100, some conducting layers, whose locations are near the side edge 102, can directly extend to the sidewall portions 200d, 200e, 200f, 200g or 200h of the recess 200 without extending to the distant side edge 101. Therefore, the connective paths of the conducting layers can be significantly shortened, the speed of transmitting signals can be increased, and the occupied surface area of the semiconductor substrate 100 can be reduced.

Figure 9:
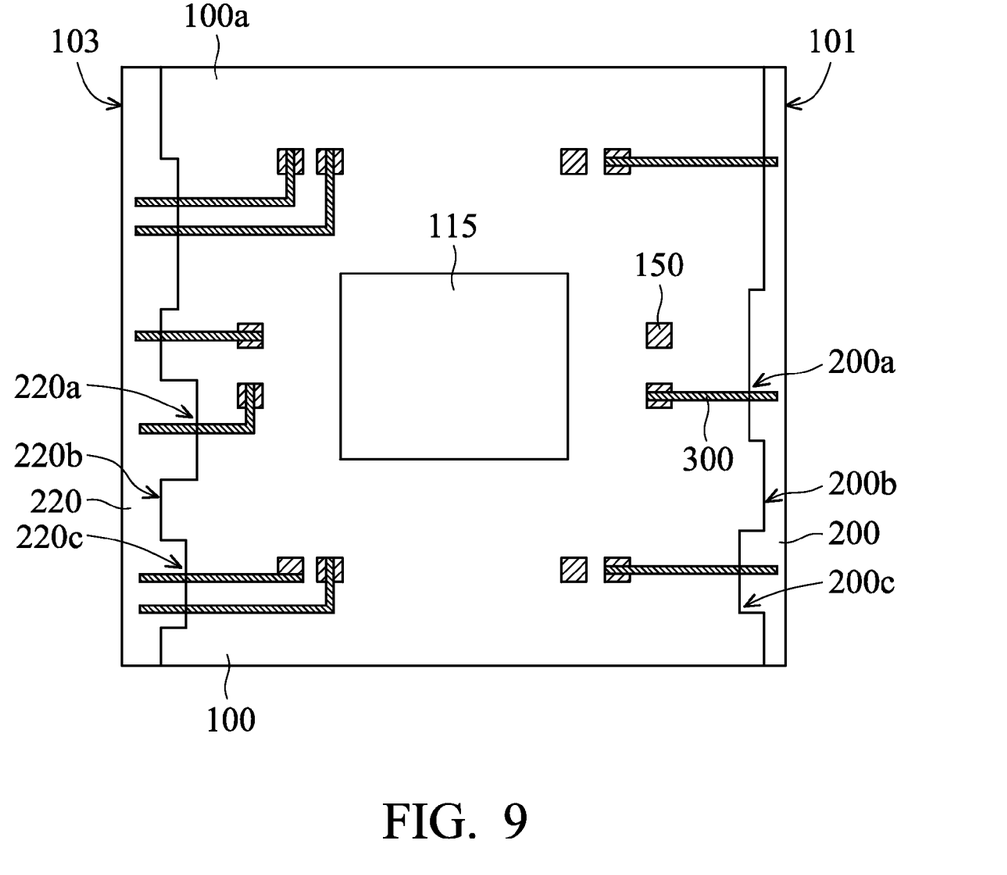

The chip package structure shown in FIG. 9 is similar to that shown in FIG. 7. The difference therebetween is that the chip package shown in FIG. 9 further comprises another recess 220. The recess 220 is located in the semiconductor substrate 100 and extends from the first surface 100a toward the second surface 100b. The recess 220 adjoins a side edge 103, which is opposite to and parallel to the side edge 101. The recess 220 crosses the entire length of the side edge 103.

The recess 220 has a sidewall portion 220a and a sidewall portion 220b adjoining the sidewall portion 220a. The distance between the sidewall portion 220a and the side edge 103 is greater than the distance between the sidewall portion 220b and the side edge 103 as viewed from the top-view perspective. The distances between the sidewall portion 220a and the side edge 103 and between the sidewall portion 220b and the side edge 103 are greater than the distances between the sidewall portion 200a and the side edge 101 and between the sidewall portion 200b and the side edge 101. In another embodiment, the distance between the sidewall portion 220a and the side edge 103 may be less than or equal to the distance between the sidewall portion 200a and the side edge 101, and may be the same as or different from the distance between the sidewall portion 200b and the side edge 101. In another embodiment, the distance between the sidewall portion 220b and the side edge 103 may be less than or equal to the distance between the sidewall portion 200a and the side edge 101, and may be the same as or different from the distance between the sidewall portion 200b and the side edge 101.

In the embodiment, the recess 220 further has a sidewall portion 220c adjoining the sidewall portion 220b. The distance between the sidewall portion 220c and the side edge 103 is greater than the distance between the sidewall portion 220b and the side edge 103 and is less than the distance between the sidewall portion 220a and the side edge 103 as viewed from the top-view perspective. In another embodiment, the distance between the sidewall portion 220c and the side edge 103 may be greater than the distance between the sidewall portion 220b and the side edge 103, and may be greater than or equal to the distance between the sidewall portion 220a and the side edge 103. In yet another embodiment, the distance between the sidewall portion 220c and the side edge 103 may be less than the distance between the sidewall portion 220b and the side edge 103, and may be the same as or different from the distance between the sidewall portion 220a and the side edge 103.

Although not shown in the figures, those skilled in the art will appreciate that the number of sidewall portions of the recess, the distance between the sidewall portion and the corresponding side edge, the extending direction of the conducting layer, and the position of the conducting pad may have other configurations as long as the recess extends across an entire length of one side edge of the semiconductor substrate and the distances between the sidewall portions and the corresponding side edges are different. In addition, since the side recess crosses the entire length or width of the side edge of the semiconductor substrate, the layout flexibility of the output signals of the chip package is increased.

The various aforementioned embodiments of the chip package shown in FIGS. 2 to 4 may be implemented to the various embodiments of the chip package shown in FIGS. 6 to 9. For example, the chip package structure shown in FIG. 10 is similar to that shown in FIG. 9. The difference therebetween is that the semiconductor substrate 100 of the chip package shown in FIG. 10 comprises a plurality of spacers 400 and 400' protruding from the bottoms of the recesses 200 and 220. The pitches between the spacers may be the same or different. The spacers can extend from any sidewall of the recesses 200 and 220 to the corresponding side edge 101 or 103 along the extending direction of the conducting layers 300.

In one embodiment, the conducting layer 300 may extend between two the spacers 400' and the pitch between the two spacers 400' is not greater than the width of the conducting layer 300. As a result, the conducting layer 300 contacts and connects to the two spacers 400'. Moreover, the conducting layer 320 may extend between the spacers 400 and 400'. The pitch between the spacers 400 and 400' is greater than the width of the conducting layer 320, and the edge of the conducting layer 320 adjoins the spacer 400'.

An exemplary embodiment of a method for forming a chip package according to the invention is illustrated in FIGS. 1A to 1E and FIGS. 2 to 4, in which FIGS. 1A to 1E are cross-sectional views of an exemplary embodiment of a method for forming a chip package according to the invention, FIG. 2 is a partial perspective view of an exemplary embodiment of a chip package according to the invention, and FIGS. 3 and 4 are top-views of various exemplary embodiments of a chip package according to the invention. In order to clearly show the relative positions of elements in the chip package, a dielectric layer 130 and a passivation layer 160 are shown in FIG. 1E without being illustrated in FIGS. 2 to 4.

Referring to FIG. 1A, a semiconductor substrate 100 is provided. The semiconductor substrate 100 has a first surface 100a and a second surface 100b opposite thereto. The semiconductor substrate 100 comprises a plurality of chip regions 110 and a scribe-line region 120 separating the chip regions 110. Each chip region 110 comprises a device region 115. The device regions 115 may comprise a sensor device (not shown), such as an image-sensor device. The scribe-line region 120 is used to separate the semiconductor substrate 100 to a plurality of chip packages in a subsequent process. In one embodiment, the semiconductor substrate 100 may be a silicon wafer so as to facilitate the wafer-level packaging process.

In the embodiment, a dielectric layer 130 and a plurality of conducting pads 150 therein are formed on the first surface 100a of the semiconductor substrate 100 in each chip region 110. The conducting pads 150 may be a single conducting layer or comprise multiple conducting layers. The conducting pads 150 may be electrically connected to the sensor device in the device regions 115 through interconnection structures (not shown). The dielectric layer 130 covers the conducting pads 150 and has openings exposing the conducting pads 150. The dielectric layer 130 may be a single dielectric layer or it may comprise multiple dielectric layers. In the embodiment, the dielectric layer 130 may comprise oxide, nitride or another suitable dielectric material.

Referring to FIG. 1B, a portion of the dielectric layer 130 in the scribe-line region 120 is removed by lithography and etching processes to form an opening 140. The opening 140 exposes the semiconductor substrate 100 in the scribe-line region 120.

Referring to FIG. 1C, a portion of the semiconductor substrate 100 exposed by the opening 140 is removed by lithography and etching processes so as to form a recess 200. The recess 200 extends from the first surface 100a toward the second surface 100b. In one embodiment, the recess 200 is located inside of the scribe-line region 120. In another embodiment, the recess 200 may extend into the chip region 110. In the embodiment, sidewalls of the recess 200 may be perpendicular to or inclined to the first surface 100a of the semiconductor substrate 100, and the bottom of the recess 200 may be parallel or non-parallel to the first surface 100a of the semiconductor substrate 100. In one embodiment, the bottom 210 and the sidewalls of the recess 200 may be rough and uneven, and have a jagged contour. In other embodiments, a multi-step recess (not shown) composed of a plurality of continuous recesses may be formed in the semiconductor substrate 100 by multiple etching processes.

In the embodiment, a portion of the semiconductor substrate 100 is left in the recess 200 without being removed, such that the semiconductor substrate 100 has a spacer 400 protruding from the bottom 210 of the recess 200, as shown in FIG. 2. The spacer 400 is a part of the semiconductor substrate 100 so the height of the spacer 400 is equal to or less than the depth of the recess 200. In another embodiment, the semiconductor substrate 100 may have a plurality of spacers 400 spaced apart from each other. The pitches P1 and P2 between the spacers 400 may be the same, as shown in FIG. 3. The pitches P1 and P3 between the spacers 400 may be different, as shown in FIG. 4.

Referring to FIG. 1D, a passivation layer 160 is formed on the dielectric layer 130 by a deposition process (such as a coating process, a physical vapor deposition process, a chemical vapor deposition process, or another suitable process). The passivation layer 160 extends into the openings of the dielectric layer 130 to cover the conducting pads 150. The passivation layer 160 further extends onto the bottom 210 and the sidewalls of the recess 200 and the spacer 400 in the recess 200. In one embodiment, the passivation layer 160 formed on the top of the spacer 400 may be optionally removed by an etching back process.

In the embodiment, the passivation layer 160 may comprise epoxy resin, inorganic materials (such as silicon oxide, silicon nitride, silicon oxynitride, metal oxide or a combination thereof), organic polymer materials (such as polyimide, butylcyclobutene, parylene, polynaphthalenes, fluorocarbons or acrylates) or other suitable dielectric materials. Next, portions of the passivation layer 160 on the conducting pads 150 are removed by lithography and etching processes to expose portions of the conducting pads 150.

Referring to FIG. 1E, a plurality of conducting layers 300 and 310 (shown in FIG. 2) may be formed on the passivation layer 160 by a deposition process (such as a coating process, a physical vapor deposition process, a chemical vapor deposition process, an electroplating process, an electroless plating process or another suitable process) and lithography and etching processes. The conducting layers 300 extend to the exposed conducting pads 150 to electrically connect to the conducting pads 150, and further extend onto the bottom 210 and the sidewalls of the recess 200. In one embodiment, the conducting layers 300 may extend onto the sidewalls of the recess 200 without extending to the bottom 210. In one embodiment, the conducting layers 300 may comprise copper, aluminum, gold, platinum, nickel, tin, a combination thereof or another suitable conducting material.

Referring to FIG. 2, the extending direction of the conducting layers 300 and 310 is the same as that of the spacer 400, and the spacer 400 is located between the conducting layers 300 and 310. In another embodiment, each of the conducting layers 300 and 310 may extend between any two of the spacers 400, as shown in FIG. 3. In yet another embodiment, there are some spacers 400 located between the conducting layers 300 and 310, as shown in FIG. 4.

Next, a dicing process is performed along the scribe-line region 120, such that the passivation layer 160, the spacer 400, and the semiconductor substrate 100 are diced from the recess 200 so as to form a plurality of chip packages separated from each other. In another embodiment, a temporary substrate (not shown), such as a glass substrate or a silicon wafer, may be previously formed on the first surface 100a of the semiconductor substrate 100 before the dicing process. A thinning process, such as a mechanical grinding process or a chemical-mechanical polishing process, is then performed on the second surface 100b of the semiconductor substrate 100 by using the temporary substrate as a support, so as to reduce the thickness of the semiconductor substrate 100 and facilitate the subsequent dicing process.

In the embodiment, the chip package may be further disposed on a circuit board (not shown). The conducting layers 300 and 310 extending into the recess 200 are electrically connected to the circuit board through conducting structures (not shown), such as wires or solder balls.

Figure 5:
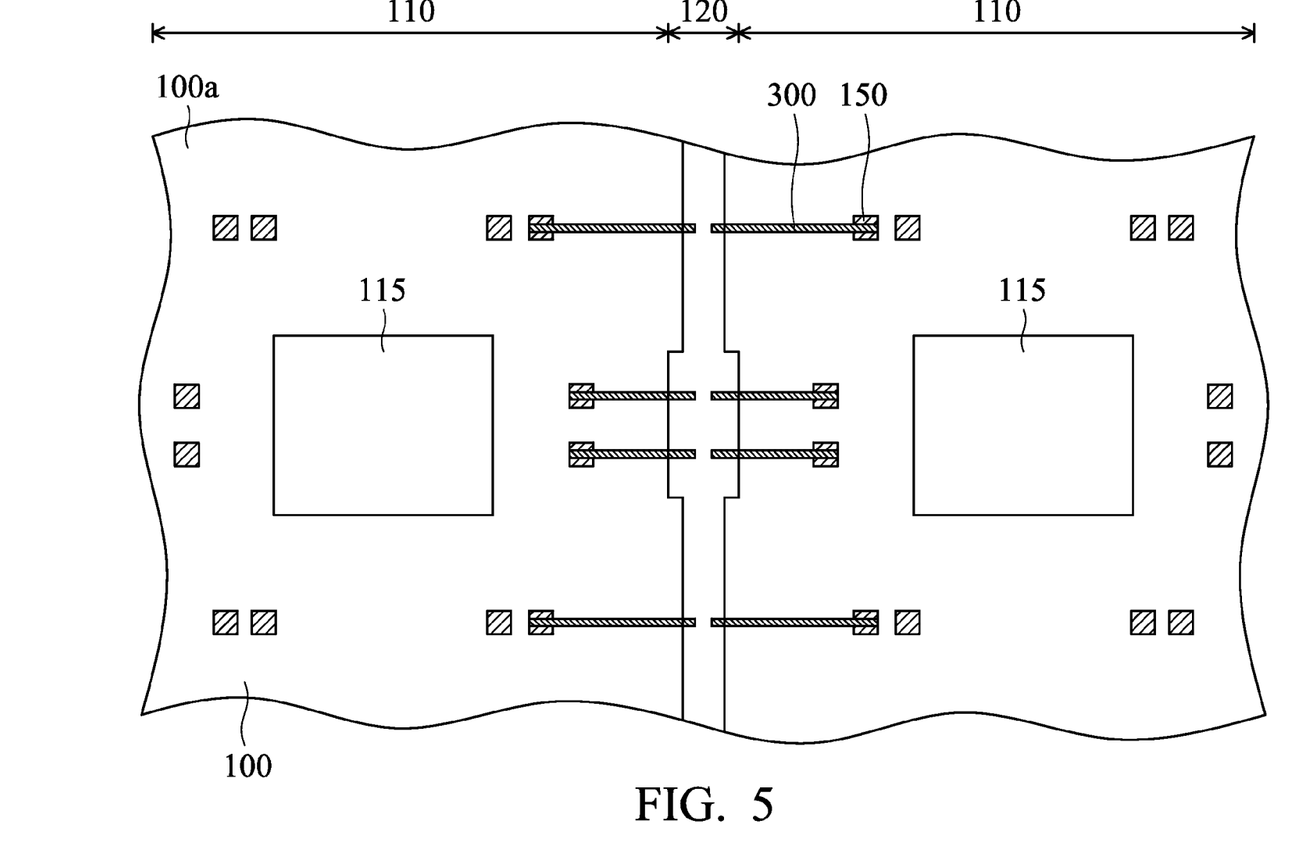
FIG. 5 is a top-view of another exemplary embodiment of a method for forming a chip package according to the invention.

Various exemplary embodiments of a method for forming a chip package according to the invention is illustrated in FIGS. 1A to 1E and FIGS. 5 to 10, in which FIG. 5 is a top-view of another exemplary embodiment of a method for forming a chip package according to the invention, and FIGS. 6 to 10 are top-views of various exemplary embodiments of a chip package according to the invention. In order to clearly show the relative positions of elements in the chip package, a dielectric layer 130 and a passivation layer 160 are shown in FIG. 1E without being illustrated in FIGS. 5 to 10.

Referring to FIG. 1A, a dielectric layer 130 and a plurality of conducting pads 150 therein are formed on a first surface 100a of a semiconductor substrate 100. Referring to FIG. 1B, an etching process is then performed on the dielectric layer 130 in the scribe-line region 120 to form an opening 140 in the dielectric layer 130 and to expose a portion of the semiconductor substrate 100. Referring to FIG. 1C, an etching process is then performed on the semiconductor substrate 100 exposed by the opening 140 to form a recess 200 in the semiconductor substrate 100. The recess 200 extends from the first surface 100a toward the second surface 100b. In one embodiment, the recess 200 is located inside of the scribe-line region 120.

In the embodiment, the recess 200 has a first portion and a second portion adjoining the first portion. A first distance between two opposite sidewalls of the first portion is greater than a second distance between two opposite sidewalls of the second portion as viewed from the top-view perspective, as shown in FIG. 5.

Next, referring to FIG. 1D, a patterned passivation layer 160 may be formed on the dielectric layer 130 by a deposition process and lithography and etching processes. The passivation layer 160 extends into the openings of the dielectric layer 130 to cover a portion of the conducting pads 150. The passivation layer 160 further extends onto the bottom 210 and the sidewalls of the recess 200.

Referring to FIG. 1E, a plurality of conducting layers 300 may be formed on the passivation layer 160 by a deposition process and lithography and etching processes. The conducting layers 300 extend to the exposed conducting pads 150 to electrically connect thereto, and further extend onto the bottom 210 and the sidewalls of the recess 200.

Next, a dicing process is performed along the scribe-line region 120, such that the passivation layer 160 and the semiconductor substrate 100 are diced from the recess 200 so as to form a plurality of chip packages separated from each other. FIG. 6 illustrates the chip package that is formed by performing a dicing process on the semiconductor substrate 100 shown in FIG. 5.

In another embodiment, before the dicing process, the recess 200 in the semiconductor substrate 100 further has a third portion adjoining the second portion. A third distance between two opposite sidewalls of the third portion is the same as or different from the first distance and is different from the second distance as viewed from the top-view perspective. FIG. 7 illustrates the chip package that is formed by performing a dicing process on the semiconductor substrate 100 which comprises the recess 200 having the first, second, and third portions.

In yet another embodiment, the step of performing an etching process on the semiconductor substrate 100 exposed by the opening 140 comprises forming a first recess and a second recess in the semiconductor substrate 100. The second recess is perpendicular to and adjoins the first recess. The first recess has a first portion and a second portion adjoining the first portion. A first distance between the two opposite sidewalls of the first portion is greater than a second distance between the two opposite sidewalls of the second portion as viewed from the top-view perspective. The second recess has a first portion and a second portion adjoining the first portion. A third distance between the two opposite sidewalls of the first portion of the second recess is different from a fourth distance between the two opposite sidewalls of the second portion of the second recess as viewed from the top-view perspective. In one embodiment, the third or fourth distance is the same as or different from the second distance. In another embodiment, the third or fourth distance is the same as or different from the first distance. FIG. 8 illustrates the chip package that is formed by performing a dicing process on the semiconductor substrate 100 which comprises the recess 200 formed of the first and second recesses.

In yet another embodiment, the step of performing an etching process on the semiconductor substrate 100 exposed by the opening 140 comprises forming a first recess 200 and a second recess 220 in the semiconductor substrate 100. The second recess 220 is parallel to the first recess 200. The first recess 200 has a first portion and a second portion adjoining the first portion. A first distance between the two opposite sidewalls of the first portion of the first recess 200 is greater than a second distance between the two opposite sidewalls of the second portion the first recess 200 as viewed from the top-view perspective. The second recess 220 has a first portion and a second portion adjoining the first portion. A third distance between the two opposite sidewalls of the first portion of the second recess 220 is different from a fourth distance between the two opposite sidewalls of the second portion of the second recess 220 as viewed from the top-view perspective. In one embodiment, the third or fourth distance is the same as or different from the second distance. In another embodiment, the third or fourth distance is the same as or different from the first distance. FIG. 9 illustrates the chip package that is formed by performing a dicing process on the semiconductor substrate 100 which comprises the first recess 200 and the second recess 220.

In other embodiments, the step of performing an etching process on the semiconductor substrate 100 exposed by the opening 140 to form the recess 200 or 220 may comprise leaving a portion of the semiconductor substrate 100 in the recess 200 or 220. As a result, the semiconductor substrate 100 has at least one spacer 400 protruding from the bottom of the recess 200 or 220. Moreover, in the subsequent dicing process, the passivation layer 160, the spacer 400 and the semiconductor substrate 100 are diced from the recess 200 or 220 so as to form a plurality of chip packages separated from each other, as shown in FIG. 10.

According to the aforementioned embodiments, the chip package comprises the recesses in the semiconductor substrate, such that the conducting layers can extend into the recesses. Therefore, the height of the conducting structures, which are electrically connected to the conducting layers, can be reduced. As a result, the entire size of the chip package is significantly decreased. Moreover, the recess extends along an entire length of the side edge of the semiconductor substrate and extends to the corners of the semiconductor substrate. As a result, the stress is reduced and the semiconductor substrate is prevented from cracking. Furthermore, the connective paths of the conducting layers can be significantly shortened thereby increasing the layout flexibility of the output signals. In addition, since the semiconductor substrate has one or more spacers protruding from the bottom of the recess and located between two conducting layers, the short circuit of the conducting layers can be prevented. Accordingly, the reliability of the chip package is improved.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a semiconductor substrate;
   a recess in the semiconductor substrate and adjoining a side edge of the semiconductor substrate, wherein the semiconductor substrate has at least one spacer protruding from a bottom of the recess, and the at least one spacer and the semiconductor substrate are made of the same material; and
   a conducting layer extending from a top surface of the semiconductor substrate onto a sidewall and the bottom of the recess.

2. The chip package as claimed in claim 1, wherein a height of the at least one spacer is equal to or less than a depth of the recess.

3. The chip package as claimed in claim 1, wherein the at least one spacer extends to the side edge along an extending direction of the conducting layer.

4. The chip package as claimed in claim 1, further comprising another conducting layer extending into the recess, wherein the at least one spacer is located between the conducting layer and the another conducting layer.

5. The chip package as claimed in claim 1, wherein the semiconductor substrate has a plurality of spacers spaced apart from each other, and the conducting layer extends between two of the plurality of spacers having a same pitch as another two of the plurality of spacers.

6. The chip package as claimed in claim 5, further comprising another conducting layer extending into the recess, wherein at least one of the plurality of spacers is located between the conducting layer and the another conducting layer.

7. The chip package as claimed in claim 1, wherein the semiconductor substrate has a plurality of spacers spaced apart from each other, and the conducting layer extends between two of the plurality of spacers having a different pitch compared to another two of the plurality of spacers.

8. A chip package, comprising:
   a semiconductor substrate;
   a recess in the semiconductor substrate, wherein the recess adjoins a side edge of the semiconductor substrate and extends along an entire length of the side edge of the semiconductor substrate, and a sidewall of the recess has a first portion and a second portion adjoining the first portion along a direction of the side edge of the semiconductor substrate as viewed from a top-view perspective, and wherein a first distance between the first portion and the side edge is greater than a second distance between the second portion and the side edge as viewed from the top-view perspective; and
   a conducting layer extending from a top surface of the semiconductor substrate onto the sidewall and a bottom of the recess.

9. The chip package as claimed in claim 8, wherein the sidewall of the recess further has a third portion adjoining the second portion, and wherein a third distance between the third portion and the side edge is equal to or different from the first distance.

10. The chip package as claimed in claim 8, wherein the recess further extends along an entire length of at least one side edge of the semiconductor substrate which adjoins the side edge.

11. The chip package as claimed in claim 10, wherein the recess has another sidewall which extends along the entire length of the at least one side edge, and the another sidewall has a first portion and a second portion adjoining the first portion, and wherein a third distance between the first portion of the another sidewall and the at least one side edge is different from a fourth distance between the second portion of the another sidewall and the at least one side edge as viewed from the top-view perspective, and the third distance or the fourth distance is equal to the second distance.

12. The chip package as claimed in claim 10, wherein the recess has another sidewall which extends along the entire length of the at least one side edge, and the another sidewall has a first portion and a second portion adjoining the first portion, and wherein a third distance between the first portion of the another sidewall and the at least one side edge is different from a fourth distance between the second portion of the another sidewall and the at least one side edge as viewed from the top-view perspective, and the third distance or the fourth distance is different from the second distance.

13. The chip package as claimed in claim 8, further comprising another recess in the semiconductor substrate, wherein the another recess adjoins another side edge of the semiconductor substrate which is opposite to the side edge, and the another recess extends along an entire length of the another side edge of the semiconductor substrate.

14. The chip package as claimed in claim 13, wherein a sidewall of the another recess has a first portion and a second portion adjoining the first portion, and wherein a third distance between the first portion of the sidewall of the another recess and the another side edge is different from a fourth distance between the second portion of the sidewall of the another recess and the another side edge as viewed from the top-view perspective, and the third distance or the fourth distance is equal to the second distance.

15. The chip package as claimed in claim 13, wherein a sidewall of the another recess has a first portion and a second portion adjoining the first portion, and wherein a third distance between the first portion of the sidewall of the another recess and the another side edge is different from a fourth distance between the second portion of the sidewall of the another recess and the another side edge as viewed from the top-view perspective, and the third distance or the fourth distance is different from the second distance.

16. The chip package as claimed in claim 8, wherein the semiconductor substrate has at least one spacer protruding from the bottom of the recess.

17. The chip package as claimed in claim 16 further comprising another conducting layer extending into the recess, wherein the at least one spacer is located between the conducting layer and the another conducting layer.

18. The chip package as claimed in claim 16, wherein the semiconductor substrate has a plurality of spacers spaced apart from each other, and the conducting layer extends between two of the plurality of spacers.

19. The chip package as claimed in claim 16, further comprising another conducting layer extending into the recess, wherein at least one of the plurality of spacers is located between the conducting layer and the another conducting layer.

20. A method for forming a chip package, comprising:
   providing a semiconductor substrate;
   forming a recess in the semiconductor substrate and at least one spacer in the recess, wherein the at least one spacer protrudes from a bottom of the recess, and the at least one spacer and the semiconductor substrate are made of the same material;

forming a conducting layer extending from a top surface of the semiconductor substrate onto a sidewall and the bottom of the recess; and cutting the semiconductor substrate, such that the recess is adjoining a side edge of the semiconductor substrate.

21. A method for forming a chip package, comprising:

providing a semiconductor substrate;

forming a recess in the semiconductor substrate, wherein the recess has a first portion and a second portion adjoining the first portion, and wherein a first distance between two opposite sidewalls of the first portion is greater than a second distance between two opposite sidewalls of the second portion as viewed from a top-view perspective;

forming a conducting layer extending from a top surface of the semiconductor substrate onto a sidewall and the bottom of the recess; and cutting the semiconductor substrate, such that the recess adjoins and crosses a side edge of the semiconductor substrate and extends along an entire length of the side edge of the semiconductor substrate, and a sidewall of the recess has the first portion and the second portion adjoining the first portion along a direction of the side edge of the semiconductor substrate as viewed from a top-view perspective, and wherein a first distance between the first portion and the side edge is greater than a second distance between the second portion and the side edge as viewed from the top-view perspective.

* * * * *